United States Patent
Jacob et al.

(10) Patent No.: US 9,263,587 B1
(45) Date of Patent: Feb. 16, 2016

(54) FIN DEVICE WITH BLOCKING LAYER IN CHANNEL REGION

(71) Applicant: GLOBALFOUNDRIES Inc., Grand Cayman (KY)

(72) Inventors: Ajey P. Jacob, Watervliet, NY (US); Min-Hwa Chi, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/476,830

(22) Filed: Sep. 4, 2014

(51) Int. Cl.
*H01L 21/265* (2006.01)
*H01L 29/78* (2006.01)
*H01L 21/02* (2006.01)
*H01L 29/66* (2006.01)
*H01L 21/311* (2006.01)
*H01L 29/16* (2006.01)
*H01L 29/06* (2006.01)
*H01L 21/8238* (2006.01)
*H01L 21/84* (2006.01)
*H01L 27/092* (2006.01)

(52) U.S. Cl.
CPC ...... *H01L 29/7851* (2013.01); *H01L 21/02164* (2013.01); *H01L 21/02255* (2013.01); *H01L 21/26513* (2013.01); *H01L 21/31111* (2013.01); *H01L 21/823807* (2013.01); *H01L 21/823821* (2013.01); *H01L 21/845* (2013.01); *H01L 27/092* (2013.01); *H01L 29/0638* (2013.01); *H01L 29/0649* (2013.01); *H01L 29/16* (2013.01); *H01L 29/6681* (2013.01); *H01L 29/66803* (2013.01); *H01L 29/785* (2013.01)

(58) Field of Classification Search
CPC ............... H01L 29/66803; H01L 29/0638; H01L 29/1083; H01L 29/167; H01L 21/26513; H01L 21/26586; H01L 21/823431; H01L 29/823821; H01L 27/092; H01L 27/0924
USPC .......................................... 438/254
See application file for complete search history.

(56) References Cited

U.S. PATENT DOCUMENTS

| | | | | |
|---|---|---|---|---|
| 6,642,090 B1 * | 11/2003 | Fried | ............... | H01L 21/823828 257/E21.635 |
| 8,058,157 B2 * | 11/2011 | Zhu | ................... | H01L 29/42384 438/479 |
| 8,372,736 B2 * | 2/2013 | Siprak | ................... | H01L 21/845 438/510 |
| 8,389,367 B2 * | 3/2013 | Zhou | ................. | H01L 29/66795 257/E21.442 |
| 9,087,860 B1 * | 7/2015 | Banghart | .......... | H01L 29/66803 |

* cited by examiner

*Primary Examiner* — Savitr Mulpuri
(74) *Attorney, Agent, or Firm* — Amerson Law Firm, PLLC (57) ABSTRACT

A method includes forming an ion implant layer in a fin defined on a semiconductor substrate. The semiconductor substrate is annealed to convert the ion implant layer to a dielectric layer. A gate electrode structure is formed above the fin in a channel region after forming the ion implant layer. The fin is recessed in a source/drain region. A semiconductor material is epitaxially grown in the source/drain region.

20 Claims, 9 Drawing Sheets

FIN DEVICE WITH BLOCKING LAYER IN CHANNEL REGION

BACKGROUND OF THE INVENTION

1. Field of the Invention

The present disclosure generally relates to the fabrication of semiconductor devices, and, more particularly, to a fin device with a blocking layer in the channel region.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors, or complementary MOSFET transistors or CMOS) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices (at 20 nm or earlier CMOS nodes) or three-dimensional (3D) devices, such as finFET devices (at 20 nm or later 14 nm CMOS nodes).

A field effect transistor (FET), irrespective of whether an NMOS transistor or a PMOS transistor is considered, and irrespective of whether it is a planar or 3D finFET device, typically includes doped source/drain regions that are formed in a semiconductor substrate that are separated by a channel region. A gate insulation layer (e.g., dielectric) is positioned above the channel region and a conductive gate electrode is positioned above the gate insulation layer. The gate insulation layer and the gate electrode may sometimes be referred to as the gate structure or gate stack for the device. By applying an appropriate voltage to the gate electrode, the channel region becomes conductive and current is allowed to flow from the source region to the drain region. In a planar FET device, the gate structure is formed above a substantially planar upper surface of the substrate. The gate structures for such planar FET devices may be manufactured using so-called "gate-first" or "replacement gate" (gate-last) manufacturing techniques.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region (leading to large leakage current between source and drain in "off-state") and the channel from being adversely affected by the electrical potential of the drain. This is sometimes referred to as a so-called short channel effect, wherein the characteristic of the FET as an active switch is degraded.

Figure 1:
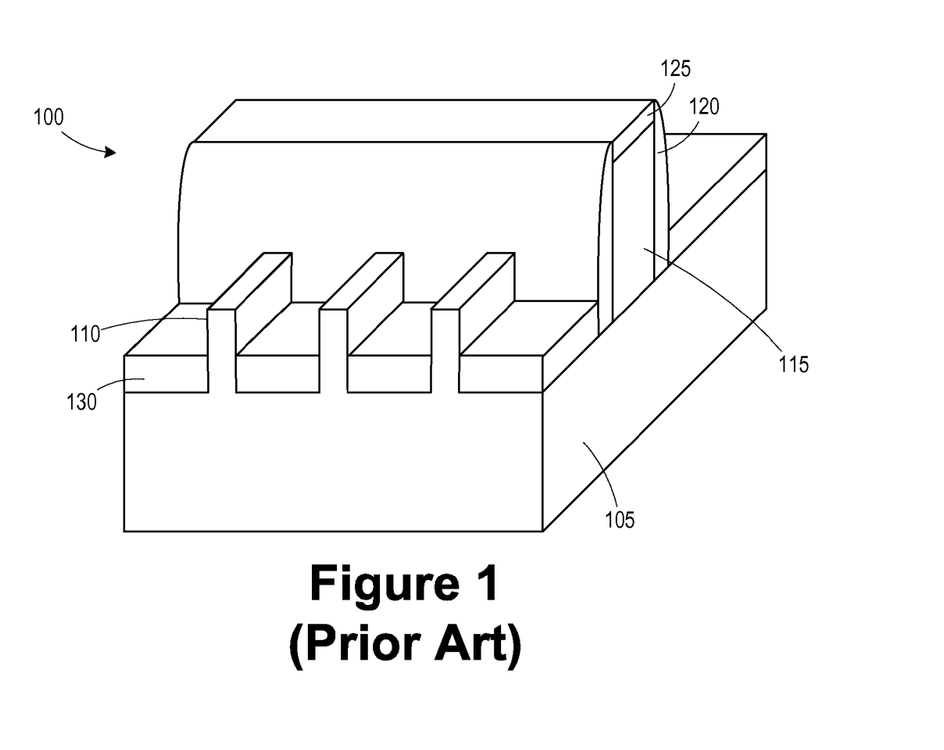
FIG. 1 schematically depicts an illustrative prior art finFET device.

In contrast to a planar MOSFET, a so-called finFET device has a three-dimensional (3D) structure. FIG. 1 is a side view of an illustrative prior art finFET semiconductor device 100 that is formed above a semiconductor substrate 105. In this example, the finFET device 100 includes three illustrative fins 110, a gate structure 115, sidewall spacers 120 and a gate cap 125. The gate structure 115 is typically made up of a layer of insulating material (not separately shown), e.g., a layer of high-k insulating material on a thin silicon dioxide interfacial layer, and one or more conductive material layers (e.g., metal, metal-nitride and/or polysilicon) that serve as the work-function material and gate electrode for the device 100. The fins 110 have a three-dimensional configuration. The portions of the fins 110 covered by the gate structure 115 define the channel region of the finFET device 100. An isolation structure 130 is formed between the fins 110, similar to the shallow trench isolation (STI) structure formed between planar transistors.

In a finFET device 100 formed above a bulk substrate, parasitic source and drain capacitances and resulting source-to-drain leakage are performance-limiting factors, similar to planar CMOS devices. To reduce source-to-drain leakage, a counter-doped implant region (i.e., using the opposite type of dopants as the source and drain), commonly referred to as a punch through stopper implant, may be provided in the lower portion of the channel region of the fin. This counter-doping of the fin reduces carrier mobility and damages to the fin due to the implantation through the fin regions. Even with a counter-doped region, the junction leakage from the source and drain to the substrate still significantly contributes to total device leakage at off-state.

Another approach involves locally implanting ions, such as oxygen, in the channel region during the gate replacement process after the sacrificial polysilicon is removed and prior to forming the replacement gate material. However, this localized oxygen ion implant often creates unbalanced strain in the device.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices. A method includes forming an ion implant layer in a fin defined on a semiconductor substrate. The semiconductor substrate is annealed to convert the ion implant layer to a dielectric layer. A gate electrode structure is formed above the fin in a channel region after forming the ion implant layer. The fin is recessed in a source/drain region. A semiconductor material is epitaxially grown in the source/drain region.

Another method includes forming an ion implant layer comprising oxygen in a fin defined on a semiconductor substrate. A gate electrode structure is formed above the fin in a channel region of a transistor device after forming the ion implant layer. The material of the fin including the ion implant layer is replaced in source/drain regions of the transistor device with a semiconductor material. The semiconductor substrate is annealed to convert the ion implant layer to a dielectric layer.

One illustrative semiconductor device disclosed herein includes, among other things, a fin defined on a substrate and a gate electrode structure formed above the fin. A channel region of the device is defined beneath the gate electrode structure and source/drain regions of the fin are defined adjacent the gate electrode structure. A dielectric layer is defined in the channel region. The dielectric layer includes oxygen and at least one of nitrogen, carbon or fluorine.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a finFET device with a blocking layer in a channel region of the device. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 2A-2F and 3A-3F illustrate various methods for forming a finFET device 200. FIGS. 2A-2F show a cross-sectional view (in the gate width direction of the device 200) of a substrate 205 with a fin 210 defined therein and isolation structures 215 formed adjacent the fin 210 to isolate the fin 210 from adjacent fins (not shown). In one illustrative example, the isolation region 215 is 100-300 nm deep and may be formed prior to or at the same time as the usual STI structures for planar transistors. The active fin 210 is ~30-50 nm above the surface of the isolation region 215. FIGS. 3A-3F illustrate a cross-sectional view of the device 200 taken through the fin 210 in a direction corresponding to the gate length direction of the device 200 (rotated 90 degrees with respect to the view of FIGS. 2A-2F).

Figure 2A:
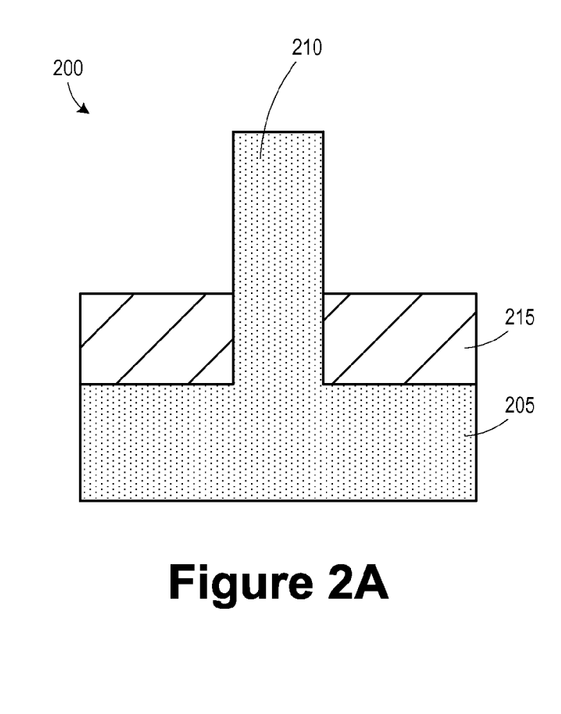
FIGS. 2A-2F and 3A-3F depict various methods disclosed herein of forming a finFET device.
Figure 3A:
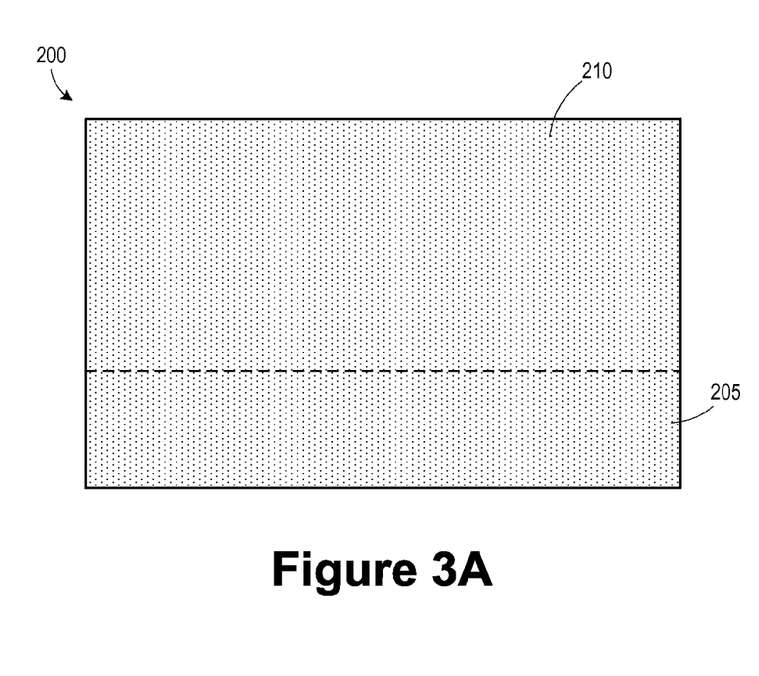

The substrate 205 may have a variety of configurations, such as the depicted bulk silicon configuration. The substrate 205 may also have a silicon-on-insulator (SOI) configuration that includes a bulk silicon layer, a buried insulation layer and an active layer, wherein semiconductor devices are formed in and above the active layer. The substrate 205 may be formed of silicon or silicon/germanium or it may be made of materials other than silicon, such as germanium. Thus, the terms "substrate" or "semiconductor substrate" should be understood to cover all semiconducting materials and all forms of such materials. The substrate 205 may have different layers. For example, the fin 210 may be formed in a process layer formed above the base layer of the substrate 205.

Figure 2B:
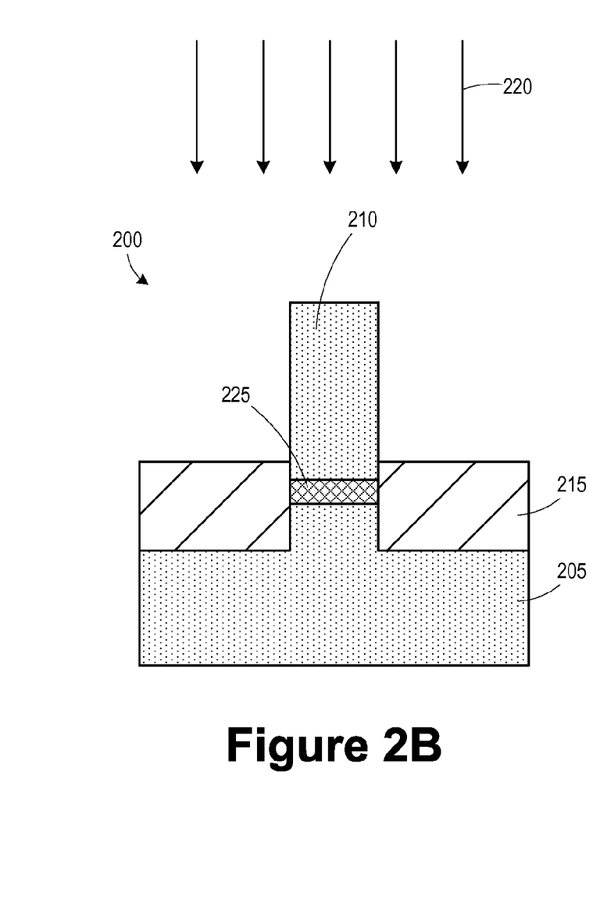
Figure 3B:
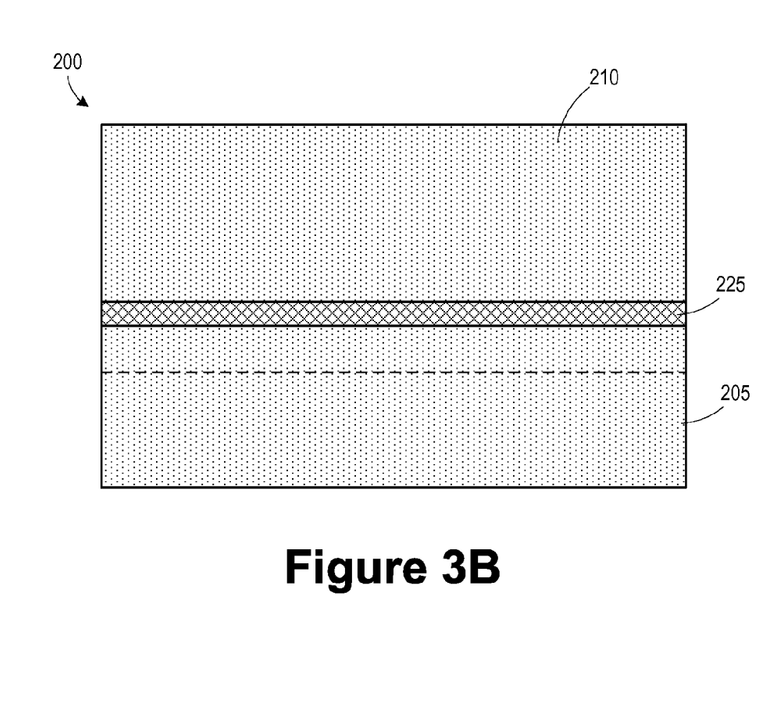

FIGS. 2B and 3B illustrate the device 200 after an implantation process 220 (e.g., vertical) is performed to generate an ion implant region 225 in the fin 210. In the illustrated embodiment, the ion implant region 225 includes oxygen ions. The implantation process 220 may be a low energy implantation through the fin to a desirable depth below the fin surface, (e.g., ~5-20 nm below the surface of the fin 215). In some embodiments, other ions, such as nitrogen, carbon or fluorine, may be co-implanted with the oxygen. Note that the implant species are also implanted into the isolation region 215 between the fins 210 with no effect to the devices.

Figure 2C:
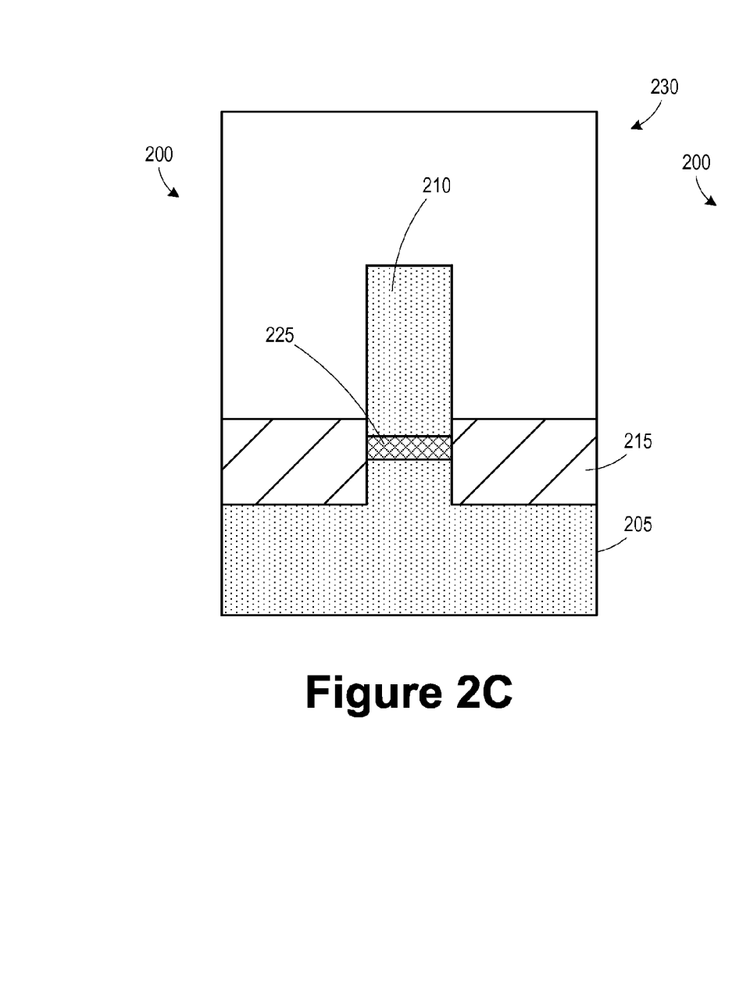
Figure 3C:
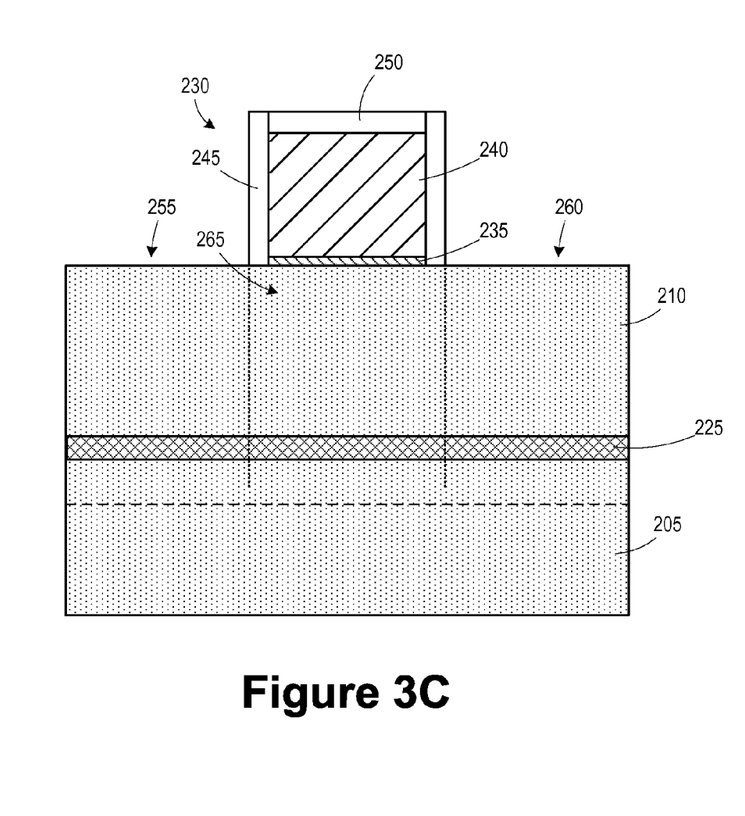

FIGS. 2C and 3C illustrate the device 200 after several processes are performed to form a placeholder (or dummy) gate electrode structure 230 above the fin 210. The placeholder gate electrode structure 230 includes a gate insulation layer 235 (e.g., silicon dioxide interfacial layer and a high-k dielectric material), a placeholder gate electrode 240 (e.g., polysilicon), sidewall spacers 245 (e.g., silicon nitride or silicon oxide) and a cap layer 250 (e.g., silicon nitride). Particular processes for forming the placeholder gate electrode structure 230 are known to those of ordinary skill in the art, so they are not explained in greater detail herein. In the illustrated embodiment, a replacement gate technique (RMG) is used to form the finFET device 200, and the placeholder gate electrode structure 230 is illustrated prior to the formation of a replacement gate structure, where the placeholder gate electrode 240 is typically replaced with a metal gate electrode. The placeholder gate electrode 240 divides the fin into source/drain (SD) regions 255, 260 and a channel region 265 therebetween.

In an alternative embodiment, the ion implant region 225 may be formed by performing an implantation process (with larger implant energy) after forming the gate insulation layer 235 and a layer of placeholder material from which the placeholder gate electrode 240 is formed. Subsequently, the gate insulation layer 235 and the layer of placeholder material may be patterned to define the placeholder gate electrode 240 and the spacers 245 and cap layer 250 may be formed.

Figure 2D:
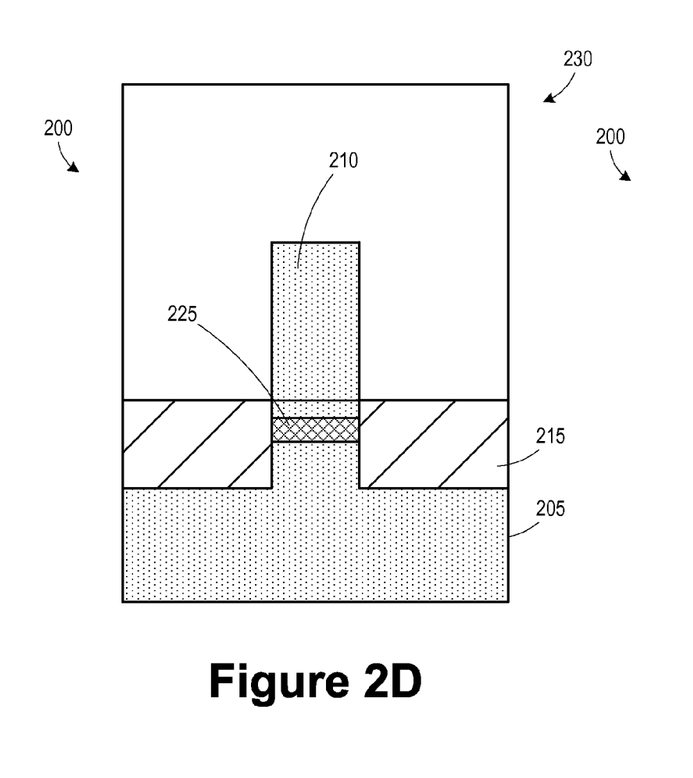
Figure 3D:
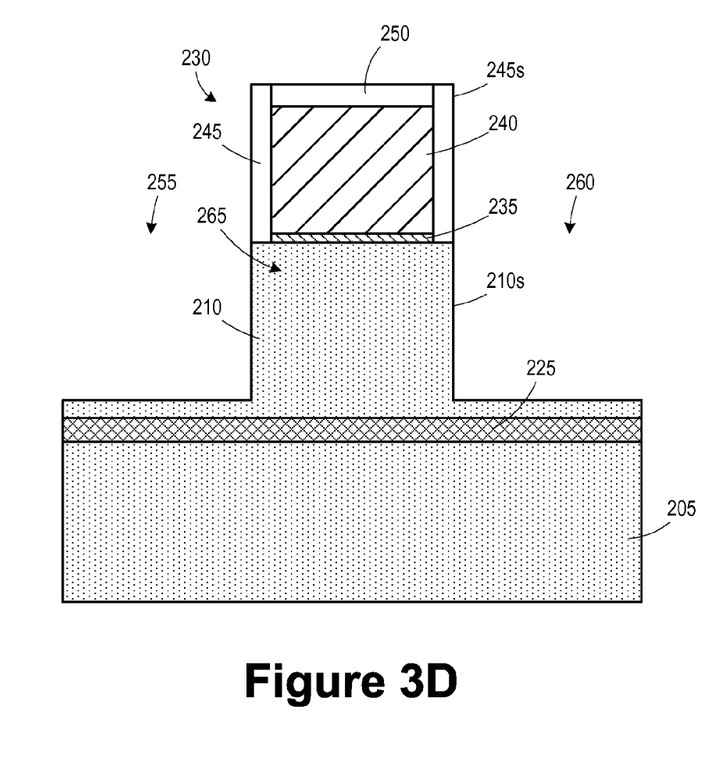

FIGS. 2D and 3D illustrate the device 200 after a silicon etch process is performed to recess the fin 210 by using the spacers 245 and cap layer 250 as an etch mask. As illustrated in FIG. 3D, the fin 210 is recessed to a height even with the isolation region 215. In some embodiments, the etch process may remove some or all of the portions of the ion implant region 225 in the SD regions 255, 260. As shown in FIG. 3D, after the fin 210 has been recessed as described above, the sidewalls 210s of the recessed fin 210 may be substantially aligned with the sidewalls 245s of the spacers 245.

Figure 2E:
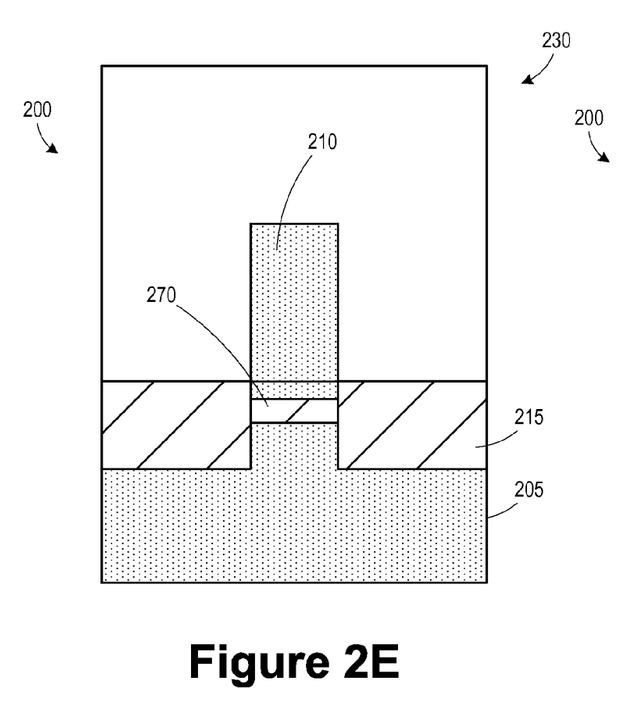
Figure 3E:
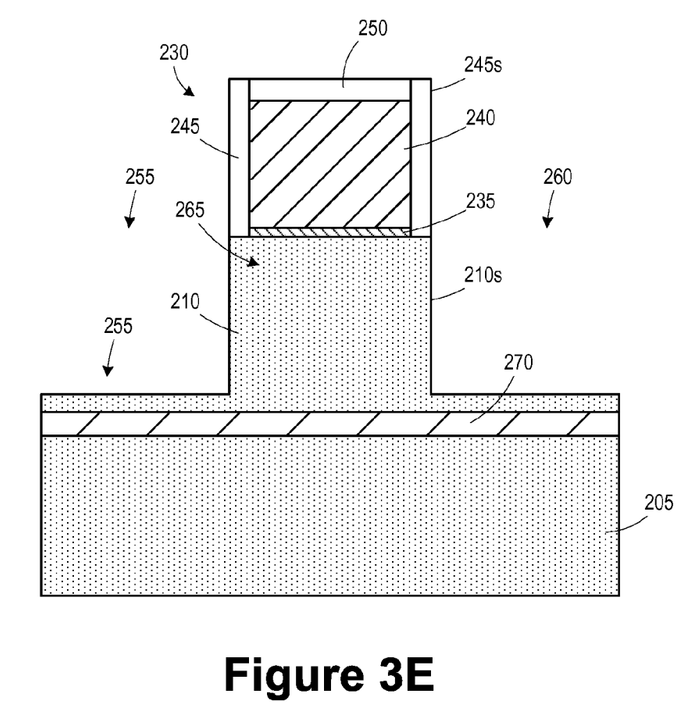

FIGS. 2E and 3E illustrate the device 200 after an anneal process (e.g., low temperature thermal anneal, etc.) is performed to densify and convert the ion implant region 225 into a dielectric layer 270 by reacting the ions (e.g., oxygen) with the silicon in the fin 210 to form an insulating layer (i.e., silicon dioxide with species of the above-described co-implants). Again, portions of the dielectric layer 270 may extend into the SD regions 255, 260.

Figure 2F:
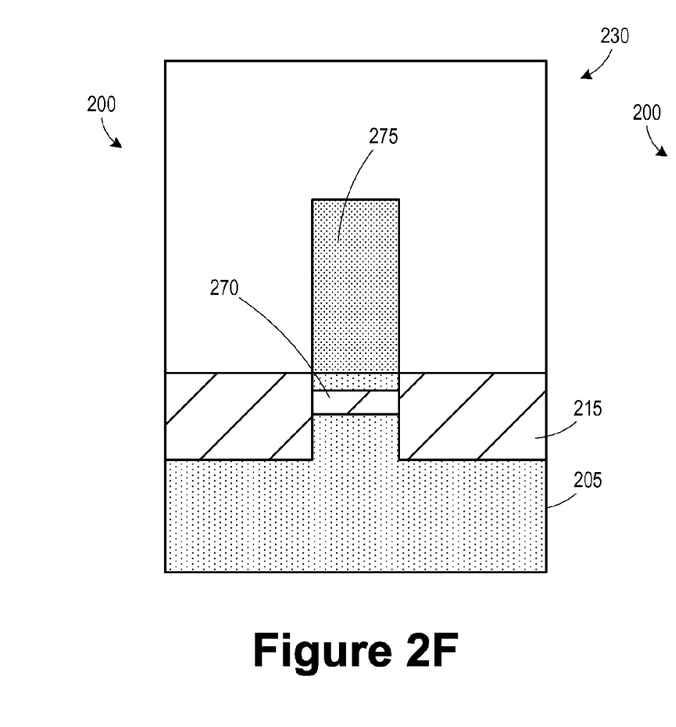
Figure 3F:
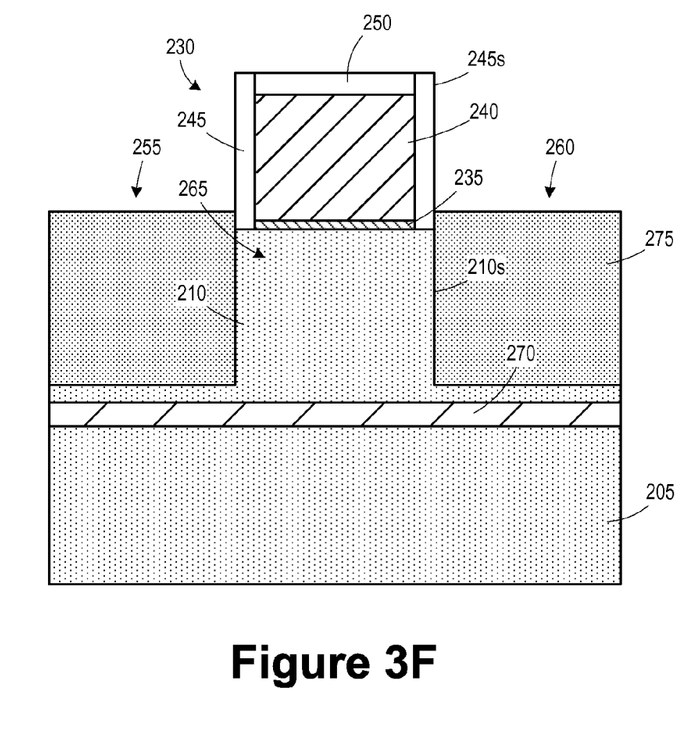

FIGS. 2F and 3F illustrate the device 200 after replacement fin portions 275 are epitaxially grown at the recessed SD portions of the fin 210. The replacement fin portions 275 may be epitaxially-grown silicon or an epitaxially-grown stress-inducing alloy, such as silicon/germanium, silicon/carbon, etc., to induce a strain in the channel region 265 to affect carrier mobility. The replacement fin portions 275 may have a generally rectangular cross-section (as illustrated) or a diamond-shaped cross-section (not shown in the cross-section view through the channel region in FIG. 2F) depending on the crystallographic orientation of the substrate 205.

The device 200 depicted herein may be part of either an NMOS or a PMOS transistor. Additionally, various doped regions, e.g., halo implant regions, well regions and the like, may be formed, but are not depicted in the attached drawings. Additional processing steps may be performed to complete fabrication of the device 200, such as the forming of a replacement gate electrode, the forming of interlayer dielectric materials and contact structures, etc.

Figure 4A:
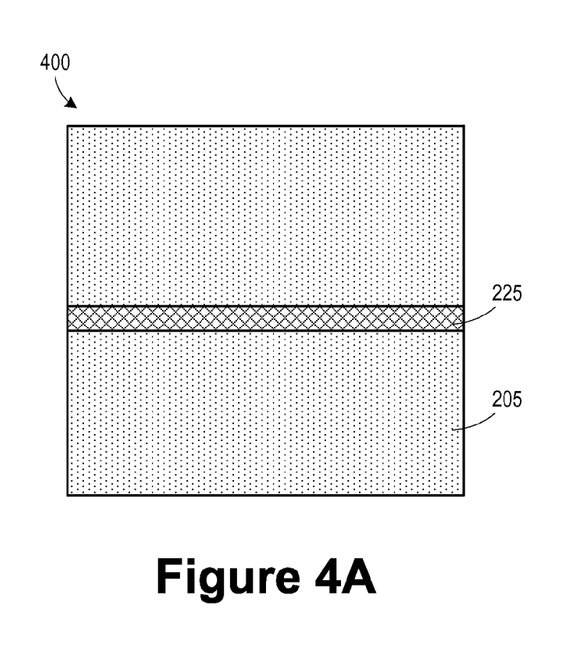
FIGS. 4A-4B and 5A-5B depict various methods disclosed herein of forming a finFET device using an alternative blocking layer implant process.
Figure 4B:
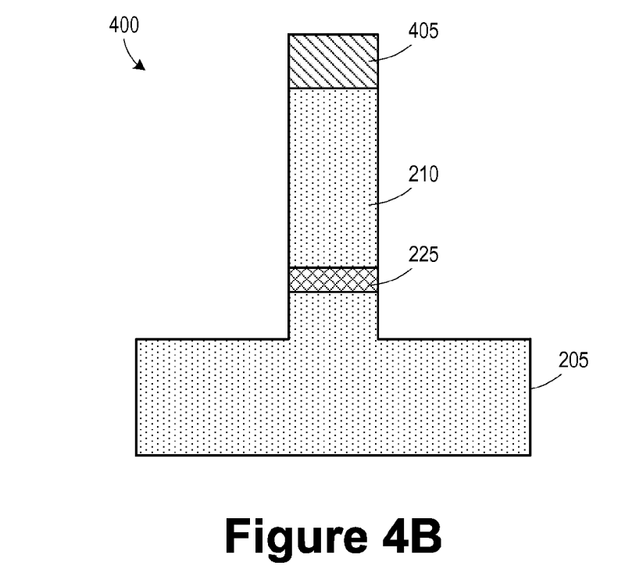
Figure 5A:
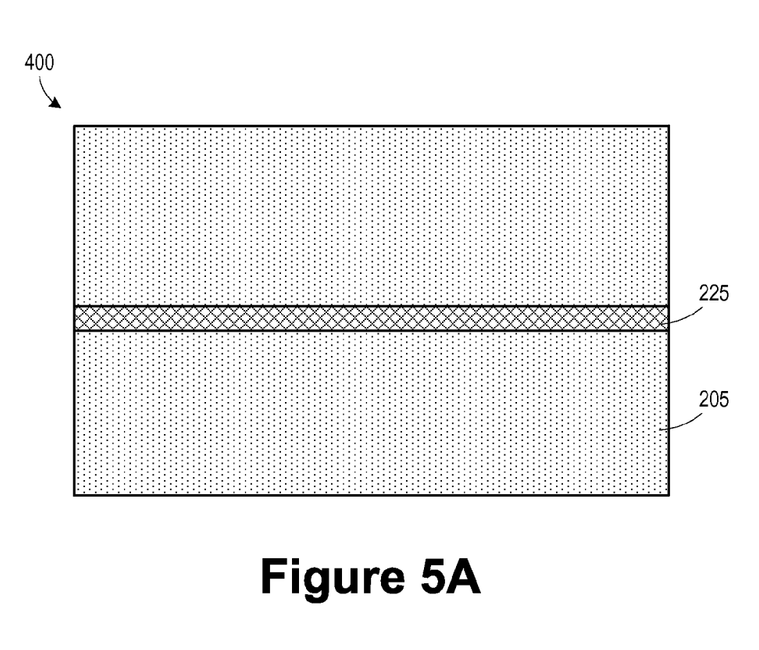
Figure 5B:
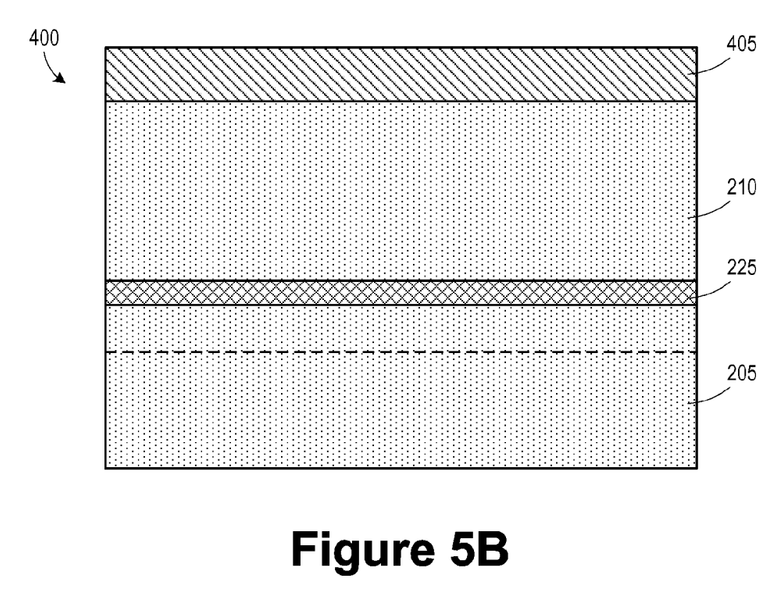

FIGS. 4A-4B and 5A-5B illustrate an alternative embodiment of a method for forming a finFET device 400 where a blanket implantation process is used to form the ion implant region 225 prior to forming the fin 210. FIGS. 4A-4B show a cross-sectional view (in the gate width direction of the device 400) of the substrate 205 after the blanket implantation to define the ion implant region 225. FIGS. 5A-5B illustrate a cross-sectional view of the device 400 in a direction corresponding to the gate length direction of the device 400 (rotated 90 degrees with respect to the view of FIGS. 4A-4B).

FIGS. 4B and 5B illustrate the device 400 after several steps have been performed to define a patterned hard mask layer 405 above the substrate 205 and to etch the substrate 205 to define the fin 210. The patterned hard mask layer 405 may be formed by depositing a hard mask material layer, forming a photoresist layer above the hard mask material layer, exposing the photoresist layer using a reticle and a radiation source to define a pattern therein, and etching the hard mask material layer using the patterned photoresist layer. A subsequent anisotropic etch process may be used to define the fin 210. Additional processing steps similar to those described above may be performed to complete the device 400, e.g., forming isolation structures 215 adjacent to the fin 210, forming a placeholder gate structure 230 including spacer 245 and cap layer 250 above the fin 210, recessing the fin 210 so as to remove the ion implant regions 225 in the SD regions, forming fin replacement portion 275, and the like.

The methods described for forming finFET devices 200, 400 herein have numerous advantages. A silicon-on-insulator (SOI) structure may be achieved without the use of a conventional SIMOX process, which requires a higher oxygen dose (e.g., $>10^{16}$ cm$^{-2}$) and a higher anneal temperature (e.g., ~1200° C.), resulting in a lower defect rate as compared to a SIMOX approach. Because the oxygen implant occurs along the entire length of the fin, the stress is balanced. The insulating layer in the bottom portion of the channel and source/drain region reduces punch through and leakage current between source and drain. The use of co-implants along with the oxygen can enhance the punch through blocking characteristics and further reduce leakage currents not only between source/drain but also junction to substrate.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming an ion implant layer in a fin defined on a semiconductor substrate;
   forming a gate electrode structure above said fin in a channel region after forming said ion implant layer;
   annealing said semiconductor substrate to convert said ion implant layer to a dielectric layer;
   recessing said fin in a source/drain region; and
   epitaxially growing a semiconductor material in said source/drain region.

2. The method of claim 1, further comprising removing at least a portion of said ion implant layer in said source/drain region while leaving a portion of said ion implant layer in said channel region during said recessing.

3. The method of claim 1, wherein said ion implant layer comprises oxygen, and the method further comprises annealing said semiconductor substrate to convert said ion implant layer to a silicon dioxide layer.

4. The method of claim 3, further comprising forming an isolation structure adjacent said fin prior to annealing said semiconductor substrate.

5. The method of claim 1, wherein forming said ion implant layer further comprises implanting an ion species into said fin using an implantation process.

6. The method of claim 5, further comprising forming a gate electrode layer above said fin prior to implanting said ion species.

7. The method of claim 6, wherein said gate electrode layer comprises an insulation layer and a placeholder material formed above said insulation layer.

8. The method of claim 7, wherein said placeholder material comprises polysilicon.

9. The method of claim 6, further comprising patterning said gate electrode layer to define said gate electrode structure after implanting said ion species.

10. The method of claim 1, wherein forming said ion implant layer further comprises:
    implanting an ion species into a layer of said semiconductor substrate; and
    etching said layer to define said fin.

11. The method of claim 1, wherein said ion species comprises oxygen and at least one of nitrogen, carbon or fluorine.

12. The method of claim 1, wherein said semiconductor material comprises silicon/germanium.

13. The method of claim 1, wherein said semiconductor material comprises silicon/carbon.

14. A method, comprising:
    forming an ion implant layer comprising oxygen in a fin defined on a semiconductor substrate;
    forming a gate electrode structure above said fin in a channel region of a transistor device after forming said ion implant layer;
    replacing the material of said fin including said ion implant layer in source/drain regions of said transistor device with a semiconductor material; and
    annealing said semiconductor substrate to convert said ion implant layer to a dielectric layer.

15. The method of claim 14, further comprising forming an isolation structure adjacent said fin prior to annealing said semiconductor substrate.

16. The method of claim 14, wherein said ion implant layer comprises oxygen and at least one of nitrogen, carbon or fluorine.

17. A semiconductor device, comprising:
    a fin defined on a substrate;
    a gate electrode structure formed above said fin, wherein a channel region of said device is defined beneath said gate electrode structure and source/drain regions of said fin are defined adjacent said gate electrode structure; and
    a dielectric layer defined in said channel region, said dielectric layer comprising oxygen and at least one of nitrogen, carbon or fluorine.

18. The device of claim 17, further comprising an epitaxial material in said source/drain regions, wherein said dielectric layer does not extend into said source/drain regions.

19. The device of claim 18, wherein said epitaxial material comprises silicon/germanium.

20. The device of claim 17, further comprising an isolation structure adjacent said fin.

* * * * *

UNITED STATES PATENT AND TRADEMARK OFFICE
CERTIFICATE OF CORRECTION

| | |
|---|---|
| PATENT NO. | : 9,263,587 B1 |
| APPLICATION NO. | : 14/476830 |
| DATED | : February 16, 2016 |
| INVENTOR(S) | : Ajey P. Jacob et al. |

It is certified that error appears in the above-identified patent and that said Letters Patent is hereby corrected as shown below:

On the title page, under abstract "20 Claims, 9 Drawing Sheets" should read --16 Claims, 9 Drawing Sheets--.

In the Claims

Col. 8, lines 7 – 23, delete "claims 17 - 20".

Signed and Sealed this
Second Day of August, 2016

Michelle K. Lee
*Director of the United States Patent and Trademark Office*